(12) United States Patent
Yoo

(10) Patent No.: US 7,236,245 B2
(45) Date of Patent: Jun. 26, 2007

(54) OVERLAY KEY WITH A PLURALITY OF CROSSINGS AND METHOD OF MEASURING OVERLAY ACCURACY USING THE SAME

(75) Inventor: Do-yul Yoo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 459 days.

(21) Appl. No.: 10/881,201

(22) Filed: Jun. 29, 2004

(65) Prior Publication Data

US 2005/0002034 A1    Jan. 6, 2005

(30) Foreign Application Priority Data

Jul. 3, 2003    (KR) .................... 10-2003-0044847

(51) Int. Cl.
*G01B 11/00*    (2006.01)
(52) U.S. Cl. .................................................. 356/401
(58) Field of Classification Search ........ 356/399–401, 356/614; 355/53, 55, 77; 250/548
See application file for complete search history.

(56) References Cited

U.S. PATENT DOCUMENTS

| | | | | |
|---|---|---|---|---|
| 5,083,378 A | * | 1/1992 | Juday | 33/1 D |
| 5,757,507 A | * | 5/1998 | Ausschnitt et al. | 356/401 |
| 5,952,134 A | * | 9/1999 | Hwang | 430/22 |
| 6,063,531 A | * | 5/2000 | Singh et al. | 430/30 |
| 6,710,876 B1 | * | 3/2004 | Nikoonahad et al. | 356/401 |
| 6,897,956 B2 | * | 5/2005 | Noguchi et al. | 356/401 |
| 7,110,099 B2 | * | 9/2006 | Littau et al. | 356/124 |

FOREIGN PATENT DOCUMENTS

KR    1998-052319    9/1998

OTHER PUBLICATIONS

English language abstract of Korean Publication No. 1998-052319.

* cited by examiner

*Primary Examiner*—Gregory J. Toatley, Jr.
*Assistant Examiner*—Isiaka O. Akanbi
(74) *Attorney, Agent, or Firm*—Marger Johnson & McCollom, P.C.

(57) ABSTRACT

An overlay key includes a main scale and a vernier scale, which traverse each other forming a plurality of crossings. The main scale includes a first main sub-scale and a second main sub-scale, which are separated from each other or at least partially overlap each other. The first and second main sub-scales extend in different directions such that they are not parallel to each other. The vernier scale includes a first vernier sub-scale and a second vernier sub-scale, which are separated from each other or at least partially overlap each other. The first and second vernier sub-scales extend in different directions such that they are not parallel to each other. Two measured crossings are obtained when the main scale and the vernier scale cross each other in a measured position. Then, overlay accuracy is measured from coordinate differences between reference crossings and the measured crossings.

24 Claims, 5 Drawing Sheets

OVERLAY KEY WITH A PLURALITY OF CROSSINGS AND METHOD OF MEASURING OVERLAY ACCURACY USING THE SAME

This application claims the priority of Korean Patent Application No. 2003-44847, filed on Jul. 3, 2003, in the Korean Intellectual Property Office, the disclosure of which is incorporated herein in its entirety by reference.

BACKGROUND OF THE INVENTION

1. Field of the Invention

The present invention relates to an overlay key and a method of measuring overlay accuracy using the same, and more particularly, to an overlay key that is used as a mark for precisely aligning two films disposed on different levels of a wafer, and to a method of measuring overlay accuracy between the films disposed on the different levels of the wafer using same.

2. Description of the Related Art

As the integration density of semiconductor devices increases, the size of patterns formed on a wafer are scaled down, and the density of the patterns increases. In particular, the density of patterns in a cell region is much higher than the density of patterns in a peripheral circuit region. Semiconductor devices, disposed in the cell region or the peripheral circuit region, are manufactured by repeating a thin-film forming process which involves depositing and patterning thin films several times.

In the thin-film forming process including photolithography and etch processes, a new film that is patterned in a current step may deviate from a thin film that has been deposited on a wafer in a previous step. Since an extent of deviation, i.e., an overlay accuracy between a current film and a previous film, greatly affects the thin-film forming process, an overlay key is used to measure the overlay accuracy of the films.

Overlay accuracy used to be measured by determining a misalignment with the naked eye using a vernier key. However, nowadays, the overlay accuracy is measured using a box-in-box overlay key, which is far more precise than the conventional vernier key.

Referring to FIG. 1, the box-in-box overlay key comprises a main scale 10 and a vernier scale 20. The vernier scale 20 forming an internal box is enclosed by the main scale 10 forming an external box and having a square plane. FIG. 1 illustrates an example of the box-in-box overlay key in which the main scale 10 is formed of a trench-shaped concave portion and the vernier scale 20 is formed of an island-shaped convex portion.

In the overlay key, a signal is obtained from image information for the overlay key, and a variation in the signal is observed as shown in FIG. 2. FIG. 2 is a waveform diagram of the signal obtained from the image information for the overlay key shown in FIG. 1, which illustrates overlay accuracy of the main scale 10 and the vernier scale 20.

Referring to FIG. 2, first peaks 31a, 31b, 31c, and 31d of a signal 30 were measured at points 10a, 10b, 10c, and 10d of the trench-shaped main scale 10, respectively, where elevation differences occur. Second peaks 32a and 32b are measured at points 20a and 20b of the island-shaped vernier key 20, respectively, where elevation differences occur.

When the conventional box-in-box overlay key is used, the peaks of the signal 30 as shown in FIG. 2 are observed, and a difference in coordinates between the main scale 10 and the vernier scale 20 is obtained to measure the overlay accuracy.

In the overlay key shown in FIG. 1, the width of the main scale is about 20 μm to 35 μm and the width of the vernier scale is about 10 μm.

Highly integrated semiconductor devices have been developed with sub-90-nm design rules. To manufacture the sub-90-nm semiconductor devices, mass production of sub-25-nm fine patterns is required. For this, a scribe line region has increasingly been scaled down.

In the box-in-box overlay key, the main scale can be formed to about 5 μm such that an overlay key formed in a scribe line region is scaled down. However, since a box-shaped vernier scale that is smaller than the main scale is formed within the main scale, it is difficult to form a smaller overlay key. Also, if the vernier scale is too small, reliability of the signal is lowered.

Thus, to control overlay accuracy between fine patterns of highly integrated devices, a new overlay key having a small size and a high accuracy is required.

SUMMARY OF THE INVENTION

The present invention provides an overlay key having a small size that is suitable for use in a scribe line region of a highly integrated semiconductor device.

The present invention also provides a method of measuring overlay accuracy, in which overlay accuracy between fine patterns is precisely measured using the small-size overlay key that is suitable for the scribe line region of the highly integrated semiconductor device, such that the reliability of data that is measured using the overlay key is improved.

According to an aspect of the present invention, there is provided an overlay key comprising a main scale and a vernier scale, which traverse each other forming a plurality of crossings.

The main scale can include a first main sub-scale and a second main sub-scale, which are separated from each other. Here, the first main sub-scale and the second main sub-scale can be rectangular patterns, each of which extends in a predetermined direction. Alternatively, the main scale can include a first main sub-scale and a second main sub-scale, which at least partially overlap each other.

The first main sub-scale and the second main sub-scale can extend in different directions such that the first main sub-scale and the second main sub-scale are not parallel to each other.

The vernier scale can include a first vernier sub-scale and a second vernier sub-scale, which are separated from each other. Here, the first vernier sub-scale and the second vernier sub-scale can be rectangular patterns, each of which extends in a predetermined direction. Alternatively, the vernier scale can include a first vernier sub-scale and a second vernier sub-scale which at least partially overlap each other.

The first vernier sub-scale and the second vernier sub-scale can extend in different directions such that the first vernier sub-scale and the second vernier sub-scale are not parallel to each other.

The main scale and the vernier scale can transverse each other forming a pair of crossings. The main scale and the vernier scale can transverse each other such that the main scale and the vernier scale form an angle of between about 0° and about 180°.

The main scale can include first and second main sub-scales having substantially rectangular configurations, each of which extends at an angle larger than about 0° with respect to a horizontal axis, and the vernier scale can include first and second vernier sub-scales with rectangular shapes, each of which extends at an angle larger than about 0° with respect to a horizontal axis.

The main scale can include first and second main sub-scales having a substantially rectangular configuration, which are separated from each other and extend substantially perpendicularly to each other, and the vernier scale can include first and second vernier sub-scales having substantially rectangular configurations, which are separated from each other and extend substantially perpendicularly to each other.

According to another aspect of the present invention, there is provided a method of measuring overlay accuracy comprising preparing an overlay key in which a main scale and a vernier scale traverse each other forming a plurality of crossings; defining reference crossings formed when the main scale and the vernier scale traverse each other in a reference position, as reference crossings; determining measured crossings when the main scale and the vernier scale traverse each other in a measured position; determining coordinate differences between the reference crossings and the measured crossings; and measuring overlay accuracy based on the coordinate differences.

To determine the coordinate differences, the distances between the reference crossings and the measured crossings are measured, and x-directional distances between the reference crossings and the measured crossings and y-directional distances between the reference crossings and the measured crossings are measured.

Also, to determine the coordinate differences, an angle between a line connecting the reference crossings and a line connecting the measured crossings is obtained, and a distance between the reference crossings is compared with a distance between the measured crossings.

According to the present invention, the overlay key can be formed sufficiently small in a scribe line region of a highly integrated semiconductor device, since a vernier scale is not formed within a main scale and the size of the vernier scale is not limited by the size of the main scale. Therefore, overlay accuracy between fine patterns can be reliably measured using a small-sized overlay key.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
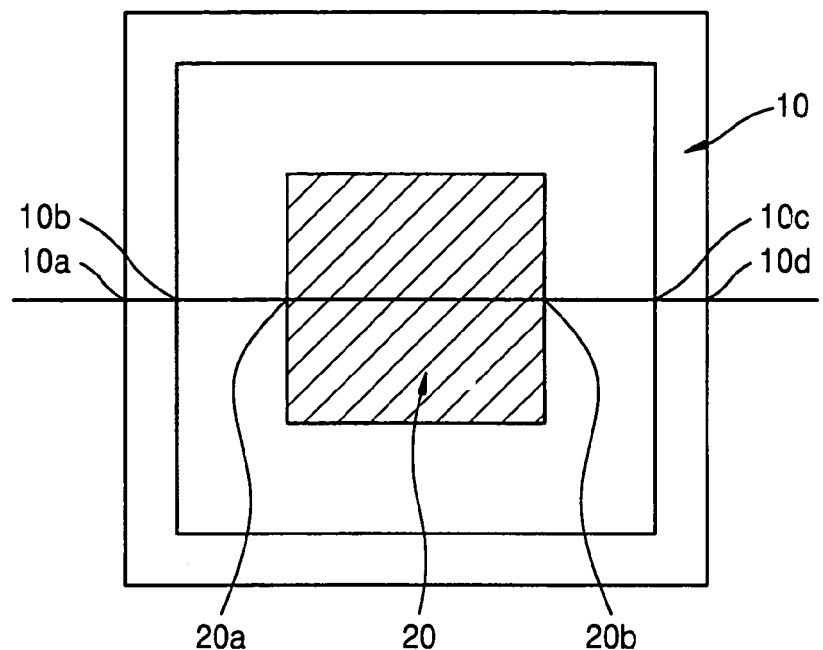
FIG. 1 is a plan view of a conventional box-in-box overlay key.
Figure 2:
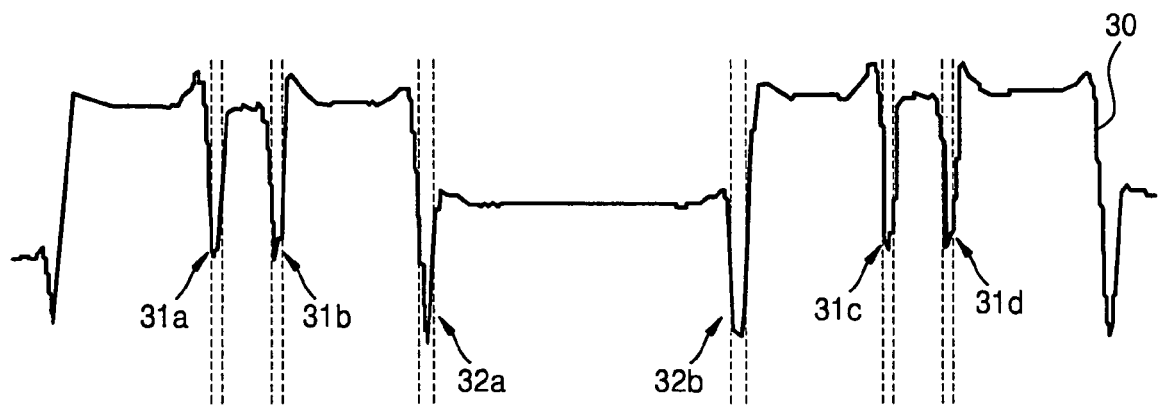
FIG. 2 is a waveform diagram of a signal obtained from image information of the overlay key shown in FIG. 1.
Figure 3:
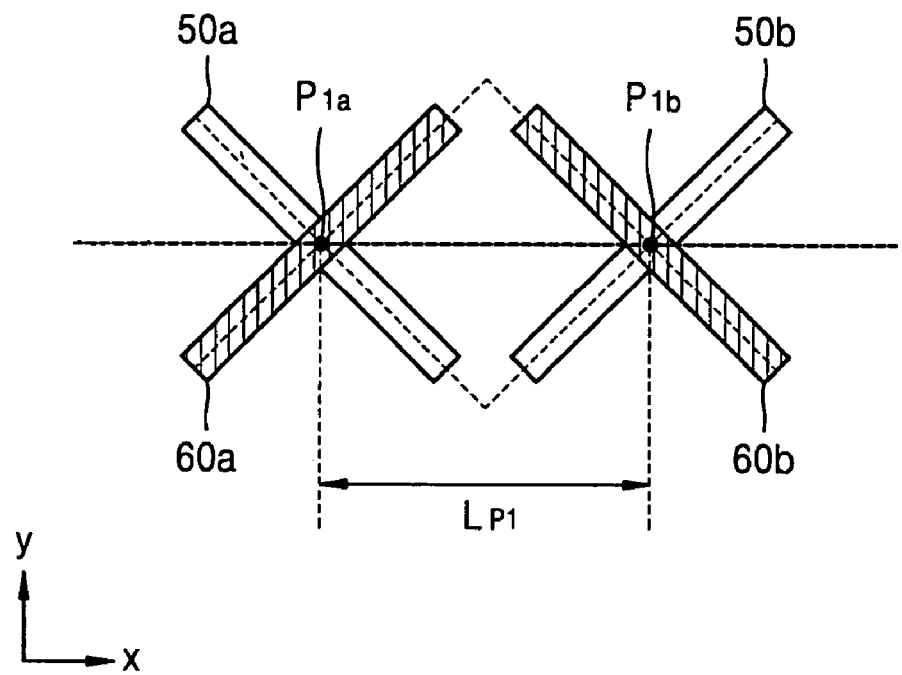
FIG. 3 is a plan view of an overlay key according to an embodiment of the present invention.

Referring to FIG. 3, the overlay key comprises a main scale $50a$ and $50b$ and a vernier scale $60a$ and $60b$, which cross each other such that a plurality of crossings $P_{1a}$ and $P_{1b}$ are formed. The main scale $50a$ and $50b$ and the vernier scale $60a$ and $60b$ cross each other at an angle that is between 0° and 180°. The main scale $50a$ and $50b$ and the vernier scale $60a$ and $60b$ are formed in a scribe region that is disposed on the same wafer as a photo mask.

The main scale $50a$ and $50b$ includes a first main sub-scale $50a$ and a second main sub-scale $50b$, which are separated rectangular patterns, each of which extends at an angle larger than 0° with respect to a direction x. Also, the vernier scale $60a$ and $60b$ includes a first vernier sub-scale $60a$ and a second vernier sub-scale $60b$, which are separated rectangular patterns, each of which extends at an angle larger than 0° with respect to the direction x.

While the main scale $50a$ and $50b$ or the vernier scale $60a$ and $60b$ in FIG. 3 includes a pair of separated patterns, the present invention is not limited thereto. Although not shown in the drawings, at least one portion of the first main sub-scale $50a$ may be connected to the second main sub-scale $50b$, and the first and second main scales $50a$ and $50b$ may extend in different directions such that they are not parallel to each other. Also, at least one portion of the first vernier sub-scale $60a$ may be connected to the second vernier sub-scale $60b$, and the first and second vernier sub-scales $60a$ and $60b$ may extend in different directions such that they are not parallel to each other. Here, the main scale $50a$ and $50b$ and the vernier scale $60a$ and $60b$ cross each other at an angle that is between 0° and 180° as described above.

Figure 4:
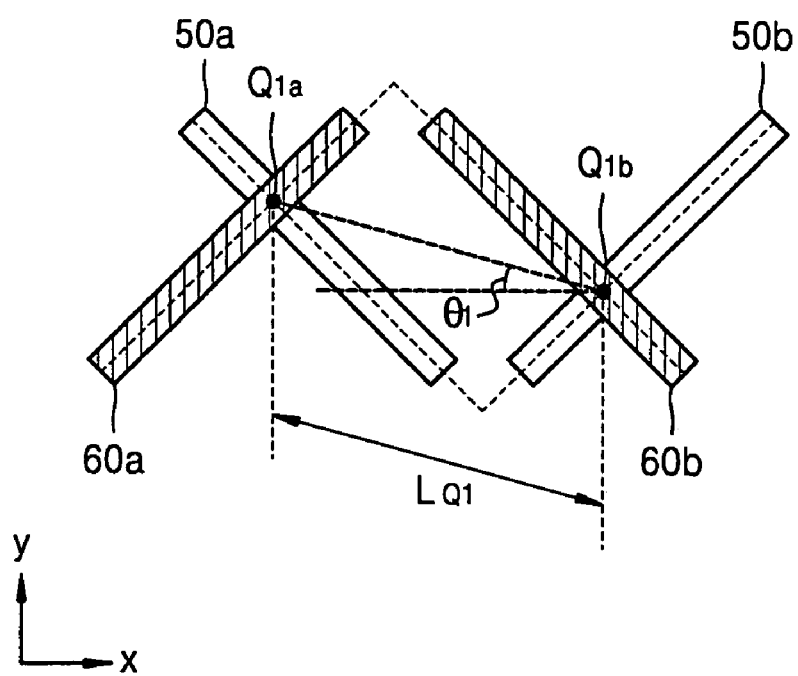
FIG. 4 is a plan view of the overlay key shown in FIG. 3 in which a main scale and a vernier scale are offset in a direction x.

FIG. 4 is a plan view of the overlay key shown in FIG. 3, in which the main scale $50a$ and $50b$ and the vernier scale $60a$ and $60b$ are offset in a direction x.

Referring to FIG. 4, a distance $L_{Q1}$ between two crossings $Q_{1a}$ and $Q_{1b}$ that is formed by the main scale $50a$ and $50b$, and the vernier scale $60a$ and $60b$, is greater than a distance $L_{P1}$ between the crossings $P_{1a}$ and $P_{1b}$, when the overlay key is in the reference position as shown in FIG. 3. Also, an angle $\theta 1$ is obtained between a line connecting the crossings $Q_{1a}$ and $Q_{1b}$ of the overlay key that is offset in the direction x, and a line connecting the crossings $P_{1a}$ and $P_{1b}$ of the overlay key that is in the reference position.

Figure 5:
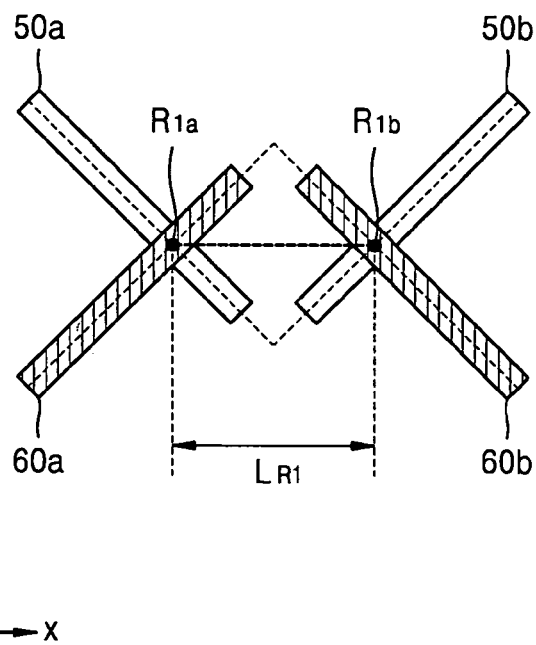
FIG. 5 is a plan view of the overlay key shown in FIG. 3 in which the main scale and the vernier scale are offset in a direction y.

FIG. 5 is a plan view of the overlay key shown in FIG. 3, in which the main scale $50a$ and $50b$ and the vernier scale $60a$ and $60b$ are offset in a direction y.

Referring to FIG. 5, a distance $L_{R1}$ between two crossings $R_{1a}$ and $R_{1b}$, that is formed by the main scale $50a$ and $50b$ and the vernier scale $60a$ and $60b$, is less than the distance $L_{P1}$ between the crossings $P_{1a}$ and $P_{1b}$, when the overlay key is in the reference position as shown in FIG. 3. Also, a line connecting the crossings $R_{1a}$ and $R_{1b}$ of the overlay key, that is offset in the direction y, is parallel to the line connecting the crossings $P_{1a}$ and $P_{1b}$ of the overlay key that is in the reference position.

Figure 6:
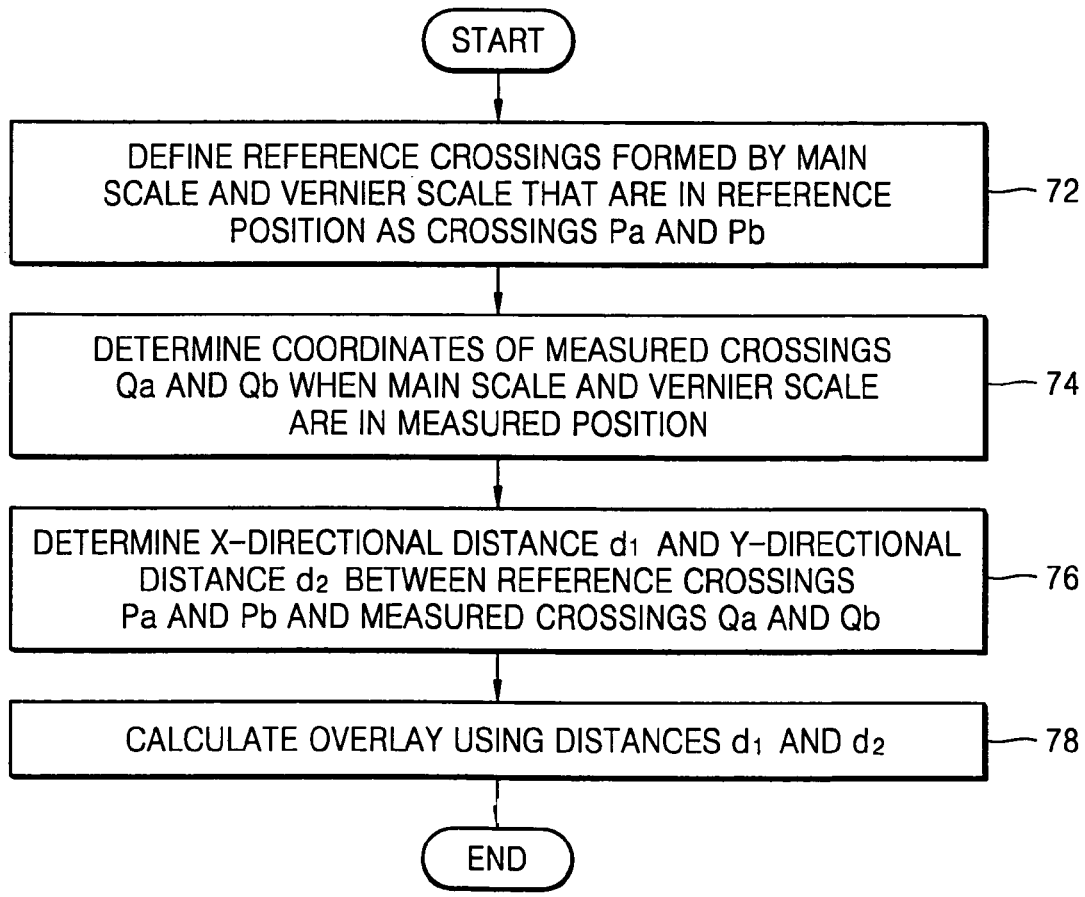
FIG. 6 is a flowchart illustrating a method of measuring overlay accuracy according to an embodiment of the present invention.

FIG. 6 is a flowchart illustrating a method of measuring overlay accuracy according to the present invention. To facilitate understanding, the method of measuring overlay accuracy will now be described with reference to the overlay keys shown in FIGS. 3 through 5.

Referring to FIGS. 3 through 6, an overlay key is prepared. The overlay key comprises a main scale 50a and 50b and a vernier scale 60a and 60b, which cross each other such that two crossings $P_{1a}$ and $P_{1b}$ are formed, as shown in FIG. 3.

When the main scale 50a and 50b and the vernier scale 60a and 60b are precisely aligned in a reference position as shown in FIG. 3, the crossings $P_{1a}$ and $P_{1b}$ are formed by the main scale 50a and 50b and the vernier scale 60a and 60b, and defined as reference crossings in step 72.

Thereafter, coordinates of two crossings $Q_{1a}$ and $Q_{1b}$ or $R_{1a}$ and $R_{1b}$, that are formed by the main scale 50a and 50b and the vernier scale 60a and 60b, which are in a measured position as shown in FIG. 4 or 5, are determined in step 74. The coordinates can be expressed using a 2-dimensional coordinate system such as Cartesian coordinates (x, y).

Thereafter, coordinate differences between the reference crossings $P_{1a}$ and $P_{1b}$, and the measured crossings $Q_{1a}$ and $Q_{1b}$ or $R_{1a}$ and $R_{1b}$, are determined in step 76.

To determine the coordinate differences, the distances between the reference crossings $P_{1a}$ and $P_{1b}$ and the measured crossings $Q_{1a}$ and $Q_{1b}$ or $R_{1a}$ and $R_{1b}$, are obtained. That is, x-directional distances $d_1$ and y-directional distances $d_2$ are determined to obtain the coordinate differences between the reference crossings P1a and P1b and the measured crossings $Q_{1a}$ and $Q_{1b}$ or $R_{1a}$ and $R_{1b}$. For example, the x-directional distance $d_1$ or the y-directional distance $d_2$ can be −2, −1, 0, +1, +2. The extent of offset between the main scale 50a and 50b and the vernier scale 60a and 60b can be calculated by using the distances $d_1$ and $d_2$. Thus, overlay accuracy is calculated from the extent of offset in step 78.

Also, the coordinate differences between the reference crossings $P_{1a}$ and $P_{1b}$, and the measured crossings $Q_{1a}$ and $Q_{1b}$ or $R_{1a}$ and $R_{1b}$, can be measured using another method. An angle θ1 between a line connecting the reference crossings $P_{1a}$ and $P_{1b}$, and a line connecting the measured crossings $Q_{1a}$ and $Q_{1b}$ or $R_{1a}$ and $R_{1b}$, is measured. Also, a distance $L_{P1}$ between the reference crossings $P_{1a}$ and $P_{1b}$ is compared with a distance $L_{Q1}$ or $L_{R1}$ between the measured crossings $Q_{1a}$ and $Q_{1b}$ or $R_{1a}$ and $R_{1b}$. Thus, the extent of offset between the main scale 50a and 50b and the vernier scale 60a and 60b is measured. Thus, overlay accuracy can be obtained.

Figure 7:
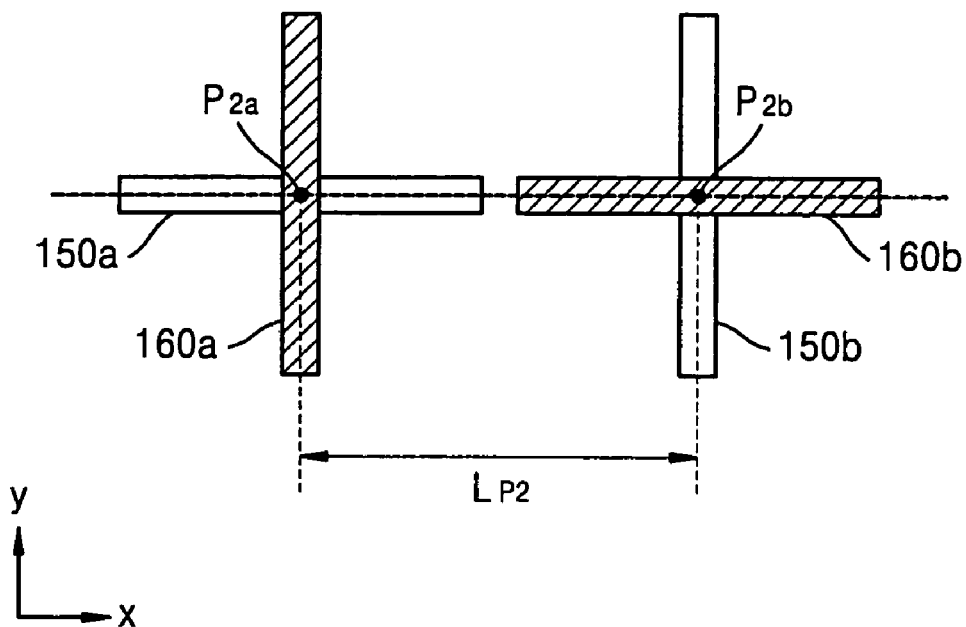
FIG. 7 is a plan view of an overlay key according to another embodiment of the present invention.

Referring to FIG. 7, as with the overlay key shown in FIG. 3, the overlay key comprises a main scale 150a and 150b, and a vernier scale 160a and 160b, which cross each other such that a plurality of crossings $P_{2a}$ and $P_{2b}$ are formed. The main scale 150a and 150b, and the vernier scale 160a and 160b, cross each other at an angle that is between 0° and 180°.

While the main scale 50a and 50b or the vernier scale 60a and 60b shown in FIG. 3 is a pair of rectangular patterns, each of which extends at an angle larger than 0° with respect to the direction x, the main scale 150a and 150b or the vernier scale 160a and 160b includes a pair of rectangular patterns that are separated from each other and extend perpendicular to each other. That is, the main scale 150a and 150b includes a first main sub-scale 150a and a second main sub-scale 150b, and the vernier scale 160a and 160b includes a first vernier sub-scale 160a and a second vernier sub-scale 160b.

Although the main scale 150a and 150b and the vernier scale 160a and 160b are each a pair of separated patterns in the present embodiment, the present invention is not limited thereto. Although not shown in the drawings, at least one portion of the first main sub-scale 150a may be connected to the second main sub-scale 150b, and the first and second main sub-scales 150a and 150b may extend perpendicular to each other. Also, at least one portion of the first vernier sub-scale 160a may be connected to the second vernier sub-scale 160b, and the first and second vernier scales 160a and 160b may extend perpendicular to each other.

Figure 8:
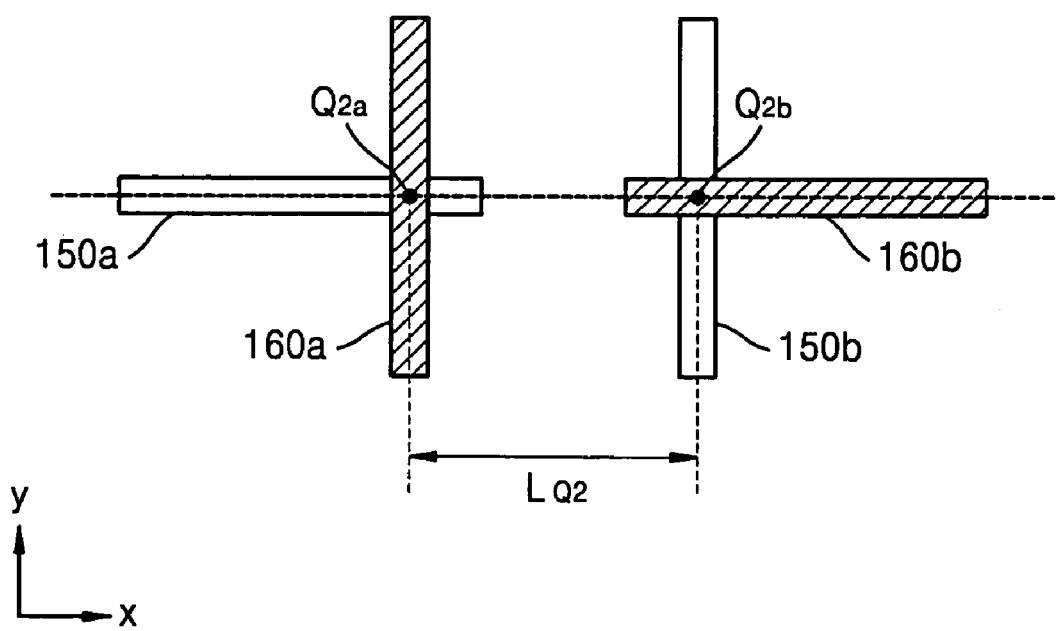
FIG. 8 is a plan view of the overlay key shown in FIG. 7 in which a main scale and a vernier scale are offset in a direction x.

Referring to FIG. 8, a distance $L_{Q2}$ between two crossings $Q_{2a}$ and $Q_{2b}$, that are formed by the main scale 150a and 150b and the vernier scale 160a and 160b, is less than a distance $L_{P2}$ between the crossings $P_{2a}$ and $P_{2b}$, when the overlay key is in the reference position as shown in FIG. 7. Also, a line connecting the crossings $Q_{2a}$ and $Q_{2b}$ of the overlay key, that is offset in the direction x, is parallel to the line connecting crossings $P_{2a}$ and $P_{2b}$ of the overlay key that is in the reference position.

Figure 9:
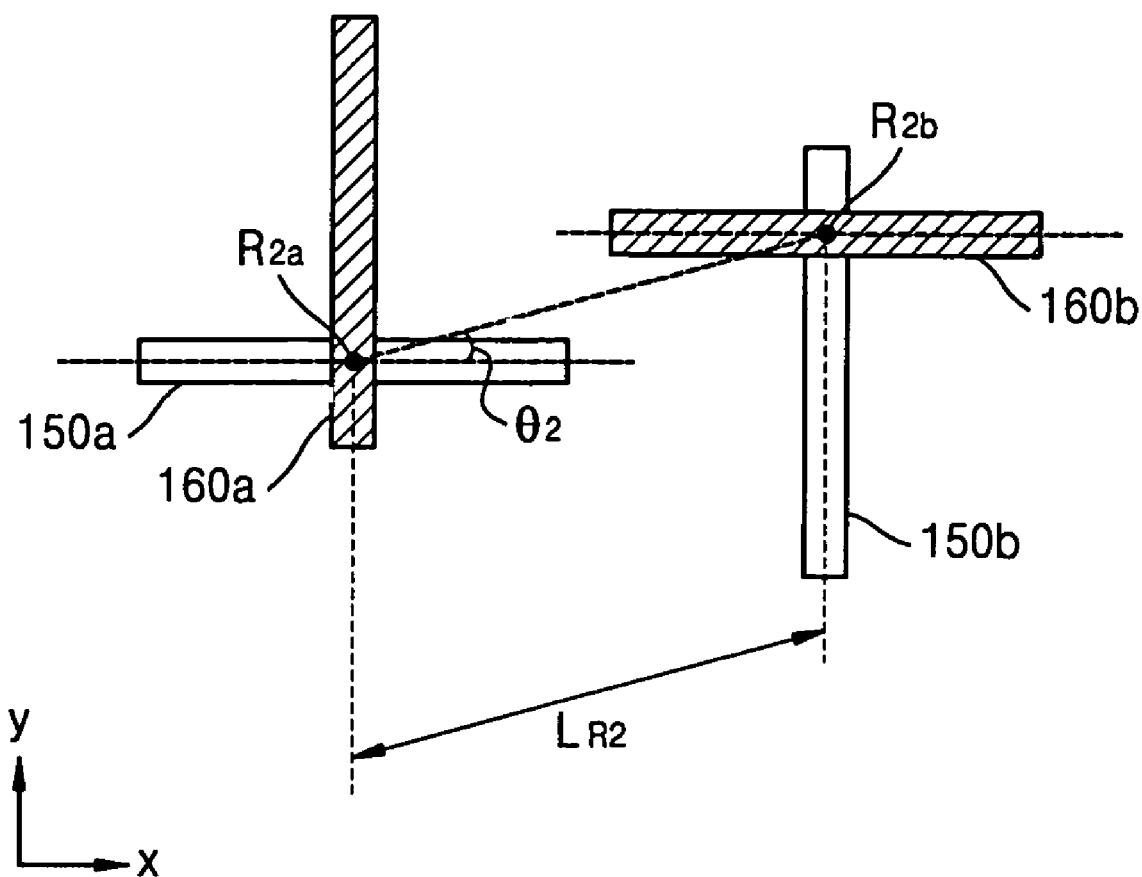
FIG. 9 is a plan view of the overlay key shown in FIG. 7 in which the main scale and the vernier scale are offset in a direction y.

Referring to FIG. 9, a distance $L_{R2}$ between two crossings $R_{2a}$ and $R_{2b}$, that are formed by the main scale 150a and 150b and the vernier scale 160a and 160b, is greater than the distance $L_{P2}$ between the crossings $P_{2a}$ and $P_{2b}$, when the overlay key is in the reference position. Also, a predetermined angle θ2 is obtained between a line connecting the two crossings $R_{2a}$ and $R_{2b}$ of the overlay key, that is offset in the direction y and a line connecting crossings $P_{2a}$ and $P_{2b}$ of the overlay key, that is in the reference position.

The method of measuring overlay accuracy, described with reference to FIG. 6, can be applied to the overlay key shown in FIG. 7 in the same manner as the overlay key shown in FIG. 3. Thus, a description thereof will be omitted.

Although two crossings are formed between the main scale and the vernier scale in the above-described embodiments of the present invention, three or more crossings may be formed between a main scale and a vernier scale if necessary. To form the three or more crossings, other various main scales and vernier scales can be formed without departing from the scope of the present invention.

The overlay key of the present invention comprises a main scale and a vernier scale, which cross each other such that a plurality of crossings are formed. The main scale and the vernier scale can each include two patterns, which are separated from each other or partially overlap each other.

The overlay key of the present invention can be formed sufficiently small in a scribe line region of a highly integrated semiconductor device, since a vernier scale is not formed within a main scale and the size of the vernier scale is not limited by the size of the main scale. Therefore, overlay accuracy between fine patterns can be reliably measured using a small-sized overlay key.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An overlay key comprising a main scale and a vernier scale which traverse each other forming a plurality of crossings, wherein the vernier scale includes a first vernier sub-scale and a second vernier sub-scale which at least partially overlap each other, and the first vernier sub-scale and the second vernier sub-scale extend in different directions such that the first vernier sub-scale and the second vernier sub-scale are not parallel to each other.

2. The overlay key of claim 1, wherein the main scale includes a first main sub-scale and a second main sub-scale, which are separated from each other.

3. The overlay key of claim 2, wherein the first main sub-scale and the second main sub-scale form substantially rectangular patterns, each of which extends in a predetermined direction.

4. The overlay key of claim 1, wherein the main scale includes a first main sub-scale and a second main sub-scale which at least partially overlap each other,
and the first main sub-scale and the second main sub-scale extend in different directions such that the first main sub-scale and the second main sub-scale are not parallel to each other.

5. The overlay key of claim 1, wherein the first vernier sub-scale and the second vernier sub-scale form rectangular patterns, each of said patterns extending in a predetermined direction.

6. The overlay key of claim 1, wherein the main scale and the vernier scale traverse each other forming a pair of crossings.

7. The overlay key of claim 1, wherein the main scale and the vernier scale cross each other such that the main scale and the vernier scale form an angle of between about 0° and about 180°.

8. The overlay key of claim 1, wherein the main scale includes first and second main sub-scales having a substantially rectangular configuration, each of which extends at an angle larger than about 0° with respect to a horizontal axis, and the vernier scale includes first and second vernier sub-scales having substantially rectangular configuration, each of which extends at an angle larger than about 0° with respect to said horizontal axis.

9. The overlay key of claim 1, wherein the main scale includes first and second main sub-scales having substantially rectangular configuration, which are separated from each other and extend substantially perpendicularly to each other, and the vernier scale includes first and second vernier sub-scales having a substantially rectangular configuration, which are separated from each other and extend substantially perpendicularly to each other.

10. The overlay key of claim 1, wherein the main scale and the vernier scale are formed in a scribe line region of a substrate.

11. A method of measuring overlay accuracy, the method comprising:
producing an overlay key in which a main scale and a vernier scale traverse each other forming a plurality of crossings;
defining reference crossings when the main scale and the vernier scale traverse each other forming a reference position;
determining measured crossings when the main scale and the vernier scale traverse each other in a measured position;
determining coordinate differences between the reference crossings and the measured crossings; and
measuring overlay accuracy based on the coordinate differences.

12. The method of claim 11, wherein the determining of the coordinate differences comprises measuring distances between the reference crossings and the measured crossings.

13. The method of claim 12, wherein the determining of the coordinate differences comprises measuring x-directional distances between the reference crossings and the measured crossings and y-directional distances between the reference crossings and the measured crossings.

14. The method of claim 11, wherein the determining of the coordinate differences comprises measuring an angle between a line connecting the reference crossings and a line connecting the measured crossings.

15. The method of claim 11, wherein the determining of the coordinate differences comprises comparing a distance between the reference crossings with a distance between the measured crossings.

16. A method for producing an overlay key comprising:
providing a main scale and a vernier scale; and
crossing said main scale and said vernier scale forming a plurality of crossings wherein the vernier scale includes a first vernier sub-scale and a second vernier sub-scale which at least partially overlap each other, and the first vernier sub-scale and the second vernier sub-scale extend in different directions such that the first vernier sub-scale and the second vernier sub-scale are not parallel to each other.

17. The method of claim 16, wherein the main scale includes a first main sub-scale and the second main sub-scale, which are separated from each other.

18. The method of claim 17, wherein the first main sub-scale and the second main sub-scale form substantially rectangular patterns, each of which extends in a predetermined direction.

19. The method of claim 16, wherein the main scale includes a first main sub-scale and a second main sub-scale which at least partially overlap each other,
and the first main sub-scale and the second main sub-scale extend in different directions such that the first main sub-scale and the second main sub-scale are not parallel to each other.

20. The method of claim 16, wherein the first vernier sub-scale and the second vernier sub-scale form rectangular patterns, each of said patterns extending in a predetermined direction.

21. An overlay key comprising a main scale and a vernier scale which traverse each other forming a plurality of crossings, wherein the main scale includes first and second main sub-scales having a substantially rectangular configuration, each of which extends at an angle larger than about 0° with respect to a horizontal axis, and the vernier scale includes first and second vernier sub-scales having substantially rectangular configuration, each of which extends at an angle larger than about 0° with respect to said horizontal axis.

22. The overlay key of claim 21, wherein the first vernier sub-scale and the second vernier sub-scale are separated at a predetermined distance from each other.

23. An overlay key comprising a main scale and a vernier scale which traverse each other forming a plurality of crossings, wherein the main scale includes first and second main sub-scales having substantially rectangular configuration, which are separated from each other and extend substantially perpendicularly to each other, and the vernier scale includes first and second vernier sub-scales having a substantially rectangular configuration, which are separated from each other and extend substantially perpendicularly to each other.

24. The overlay key of claim 23, wherein the first vernier sub-scale and the second vernier sub-scale are separated at a predetermined distance from each other.

* * * * *